(12) United States Patent
Shana'a et al.

(10) Patent No.: US 8,725,098 B2
(45) Date of Patent: May 13, 2014

(54) METHOD FOR TUNING A RF FRONT-END CIRCUIT USING AN ON-CHIP NEGATIVE TRANSCONDUCTANCE CIRCUIT TO MAKE AN OSCILLATOR

(75) Inventors: Osama K A Shana'a, Singapore (SG); Xu-Dong Jiang, Singapore (SG); Chin-Heng Leow, Singapore (SG)

(73) Assignee: MediaTek Singapore Pte. Ltd., Singapore (SG)

( * ) Notice: Subject to any disclaimer, the term of this patent is extended or adjusted under 35 U.S.C. 154(b) by 344 days.

(21) Appl. No.: 12/954,925

(22) Filed: Nov. 29, 2010

(65) Prior Publication Data
US 2011/0241797 A1 Oct. 6, 2011

Related U.S. Application Data

(60) Provisional application No. 61/318,844, filed on Mar. 30, 2010.

(51) Int. Cl.
*H04B 1/18* (2006.01)
(52) U.S. Cl.
USPC ............ 455/192.2; 455/136; 455/164.1; 455/164.2; 455/182.2

(58) Field of Classification Search
CPC .............. H03J 7/00; H03J 7/02; H04B 1/16
USPC ........... 455/192.2, 136, 164.1, 164.2, 182.2
See application file for complete search history.

(56) References Cited

U.S. PATENT DOCUMENTS

| | | | |
|---|---|---|---|
| 6,556,073 B2 * | 4/2003 | Morie et al. | 327/554 |
| 7,127,217 B2 | 10/2006 | Tuttle et al. | |
| 7,610,022 B1 * | 10/2009 | Teo et al. | 455/73 |
| 8,005,448 B1 * | 8/2011 | Yan et al. | 455/226.1 |
| 2006/0001559 A1 * | 1/2006 | Tuttle et al. | 341/120 |
| 2007/0129038 A1 * | 6/2007 | Ragan et al. | 455/226.4 |
| 2008/0081583 A1 * | 4/2008 | Zhang et al. | 455/193.1 |

* cited by examiner

*Primary Examiner* — Yuwen Pan
*Assistant Examiner* — Fatuma Sherif
(74) *Attorney, Agent, or Firm* — Winston Hsu; Scott Margo

(57) ABSTRACT

A radio-frequency (RF) front-end circuit includes a tunable filter, a negative transconductance circuit coupled with the tunable filter to produce a tuning oscillation signal, and a counter arranged to determine a frequency of the tuning oscillation signal. The RF front-end circuit also includes a control circuit arranged to shift the frequency of the tuning oscillation signal by adjusting the tunable filter until the frequency of the tuning oscillation signal falls within an acceptable frequency range corresponding to a desired channel frequency band.

29 Claims, 7 Drawing Sheets

METHOD FOR TUNING A RF FRONT-END CIRCUIT USING AN ON-CHIP NEGATIVE TRANSCONDUCTANCE CIRCUIT TO MAKE AN OSCILLATOR

CROSS REFERENCE TO RELATED APPLICATIONS

This application claims the benefit of U.S. Provisional Application No. 61/318,844, filed on Mar. 30, 2010, the contents of which are incorporated herein by reference.

BACKGROUND OF THE INVENTION

1. Field of the Invention

The present invention relates to tuning a radio-frequency (RF) front-end circuit having an embedded antenna, and in particular to a method for tuning the RF front-end circuit over a desired RF band by using an on-chip negative transconductance circuit to make an oscillator.

2. Description of the Prior Art

Radio frequency (RF) receivers are used in a wide variety of applications such as television, cellular telephones, pagers, global positioning system (GPS) receivers, cable modems, cordless phones, radios and other devices that receive RF signals. For example, with respect to frequency modulation (FM) audio broadcasts, within the United States FM audio signals are broadcast in the frequency band from 76 MHz to 108 MHz.

In conventional systems that receive terrestrial audio broadcasts, filter circuitry is often used to filter out unwanted parts of a signal spectrum that is received through an antenna. This filter circuit, therefore, acts to tune, at least in part, the incoming signal to a desired channel or portion of the RF signal spectrum. For example, with respect to FM terrestrial audio broadcasts, this filter will help tune the receiver to the desired FM channel.

FM receivers typically use headphone wires as a main long antenna. A problem with this is there is no signal reception after the headphones are disconnected from the receiver. As a result, customers now demand that receivers come with embedded antennas that provide support for receiving FM signals.

Similarly, in some applications customers demand to have an FM transmitter circuit that can take the music from a digital library device and transmit it on FM band to be played back on the car radio while driving for example. Such FM transmitters also use embedded antennas for transmission.

FIG. 1 illustrates an embedded antenna 12 formed on a printed circuit board (PCB) 10. The embedded antenna 12 can be formed in many different ways, for example as a PCB trace with no ground layer beneath. The embedded antenna 12 can also be formed as a simple wire that is wound around the housing of a device, such as a mobile phone. The embedded antenna 12 is used as an antenna for FM and other broadcast applications. The equivalent circuit model for this embedded antenna 12, which has a length that is much less than the signal wave length of the signal being received over the embedded antenna 12, is simply a capacitor, referred to here as $C_{ANT}$. The equivalent capacitor $C_{ANT}$ of the embedded antenna 12 can have a range from 1-10 pF for example.

The reception of the embedded antenna 12 is several tens of dB lower than that of a conventional long antenna used for FM reception. In order to boost the signal level at the antenna output, a shunt inductor can be used to resonate with the equivalent capacitance of the embedded antenna 12 to form a high resonance (high-Q) resulting in voltage gain. Since the desired bandwidth of the receive band is generally wideband, tank resonance frequency must be tuned. In the prior art, tunable on-chip capacitor arrays have been used, consisting of a number of capacitor branches connected in parallel via switches are used to shift the resonance frequency. However, a problem that remains in the prior art is how the tank's resonance frequency can be measured automatically and accurately in order to be tuned to the right value.

Therefore, there is a need for an improved method of tuning an embedded antenna system.

SUMMARY OF THE INVENTION

According to one embodiment, a radio-frequency (RF) front-end circuit includes a tunable filter, a negative transconductance circuit coupled with the tunable filter to produce a tuning oscillation signal, and a counter arranged to determine a frequency of the tuning oscillation signal. The RF front-end circuit also includes a control circuit arranged to shift the frequency of the tuning oscillation signal by adjusting the tunable filter until the frequency of the tuning oscillation signal falls within an acceptable frequency range corresponding to a desired channel frequency band.

According to another embodiment, a filter calibration system for a radio-frequency (RF) front-end circuit includes a tunable filter configured to be tuned to a desired channel by adjusting a tuning control signal, the tunable filter being tunable across a frequency spectrum including a plurality of channels. The filter calibration system also includes a negative transconductance circuit coupled with the tunable filter to produce a tuning oscillation signal in a calibration mode of operation. A control circuit is used to receive a feedback signal based on the tuning oscillation signal and accordingly shift a frequency of the tuning oscillation signal by adjusting the tuning control signal to shift until the frequency of the tuning oscillation signal falls within an acceptable frequency range corresponding to a desired channel frequency band. The negative transconductance circuit and the control circuit are integrated on a same integrated circuit of the RF front-end circuit.

According to yet another embodiment, a method of tuning a radio-frequency (RF) front-end circuit includes producing a tuning oscillation signal with a negative transconductance circuit coupled with a tunable filter, determining a frequency of the tuning oscillation signal, and shifting the frequency of the tuning oscillation signal by adjusting the tunable filter until the frequency of the tuning oscillation signal falls within an acceptable frequency range corresponding to a desired channel frequency band.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
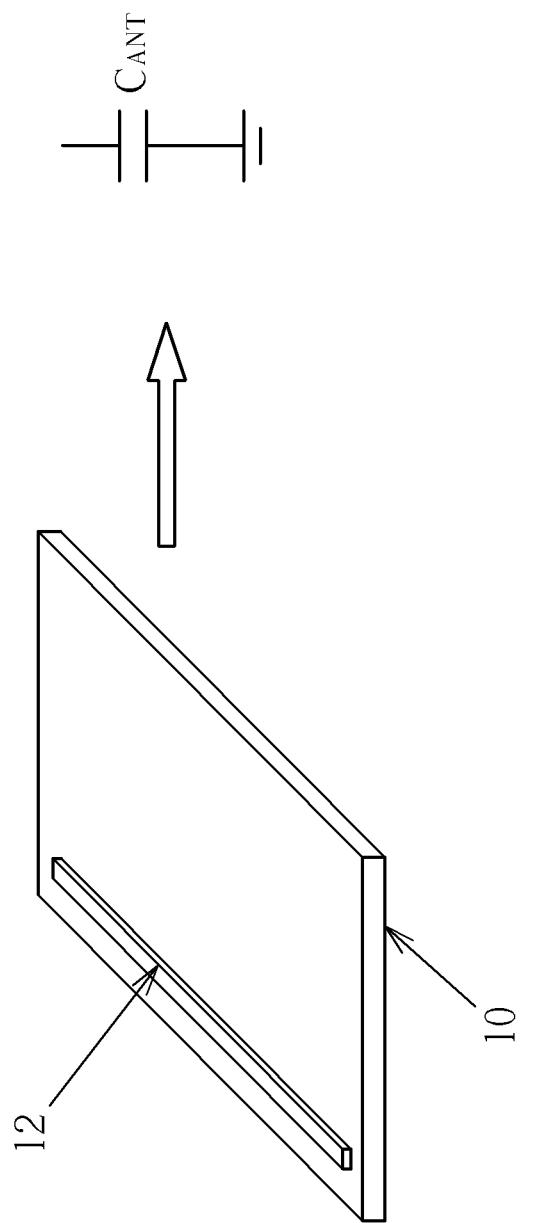
FIG. 1 illustrates an embedded antenna formed on a printed circuit board (PCB).
Figure 2:
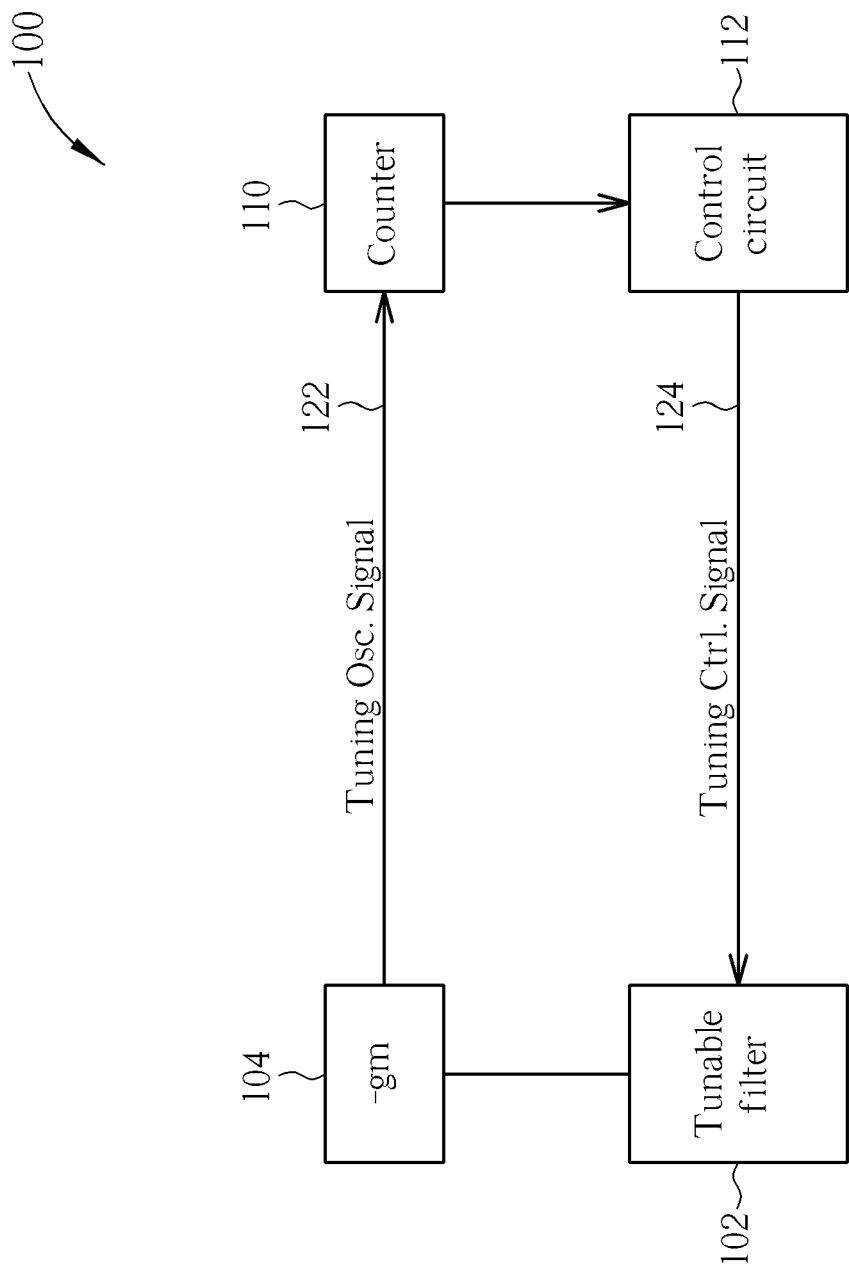
FIG. 2 illustrates a functional block diagram of a RF front-end circuit.

A radio-frequency (RF) front-end circuit with enhanced tuning method is proposed. FIG. 2 illustrates a functional block diagram of a RF front-end circuit 100. The RF front-end circuit 100 contains a tunable filter 102 that is controlled by a tuning control signal 124 output by a control circuit 112. A negative transconductance circuit 104 is connected to the tunable filter 102. At resonance the negative transconductance of the negative transconductance circuit 104 cancels the tank loss of the other elements in the RF front-end circuit 100 in order to sustain oscillation and produce a tuning oscillation signal 122.

A counter 110 measures the oscillation frequency of the tuning oscillation signal 122 to calculate a counting value. During the tuning process, the counter 110 counts the received number of pulses of the tuning oscillation signal 122 during a counting period to calculate the counting value. Meanwhile, with the aid of an on-chip precision clock, the control circuit 112 calculates an expected number of pulses of the tuning oscillation signal 122 that should be received during the counting period if the RF front-end circuit 100 is properly tuned to the correct frequency, which is a desired channel frequency band. The counter 110 then outputs the counting value to the control circuit 112 in order for the control circuit 112 to compare the counting value with the expected number of pulses. If the counting value is not within the predetermined range of the expected value, the control circuit 112 changes the value of the tuning control signal 124 to adjust the tunable filter 102, thereby adjusting the oscillation frequency of the tuning oscillation signal 122. Once the tuning oscillation signal 122 is within an acceptable range of the desired channel frequency band, the control circuit 112 latches the desired value of the tuning control signal 124 and then the negative transconductance circuit 104 is disabled for normal mode operation. Using a feedback loop created by the tunable filter 102, the negative transconductance circuit 104, the counter 110, and the control circuit 112, the frequency of the RF front-end circuit 100 can be tuned quickly, accurately, and automatically.

Figure 3:
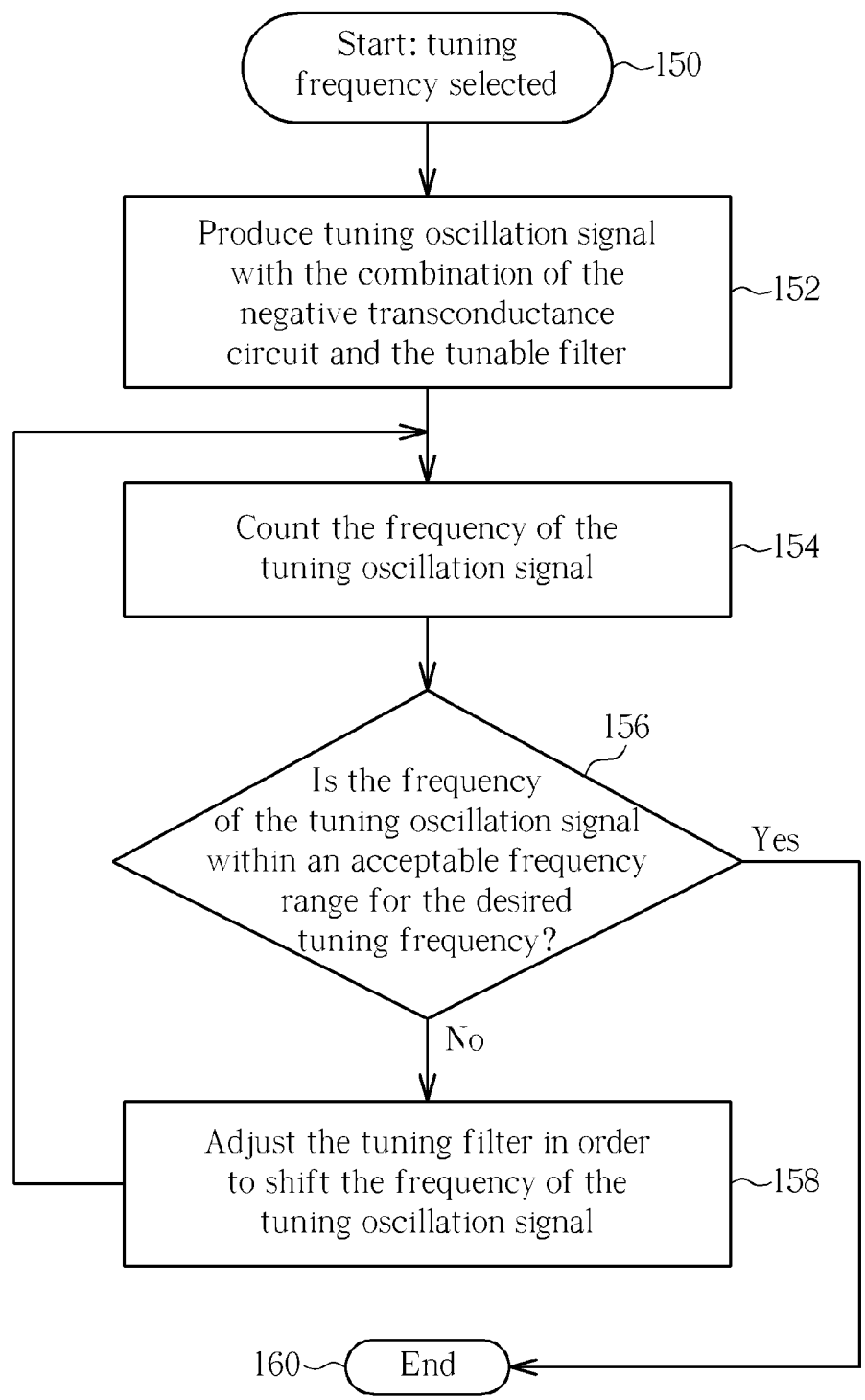
FIG. 3 is a flowchart summarizing the frequency tuning method performed by the RF front-end circuit illustrated in FIG. 2.

FIG. 3 is a flowchart summarizing the frequency tuning method performed by the RF front-end circuit 100 illustrated in FIG. 2. In step 150, a desired tuning frequency is selected for the RF front-end circuit 100. In step 152, the tuning oscillation signal 122 is produced with the combination of the negative transconductance circuit 104 and the tunable filter 102. Next, the frequency of the tuning oscillation signal 122 is counted by the counter 110 in step 154. The control circuit 112 then determines in step 156 if the frequency of the tuning oscillation signal 122 is within an acceptable frequency range for the desired tuning frequency. If so, the step 160 is executed. Otherwise, step 158 is executed. In step 158, the control circuit 112 adjusts the tunable filter 102 with the tuning control signal 124 in order to shift the frequency of the tuning oscillation signal 122. The tuning method ends in step 160.

Figure 4:
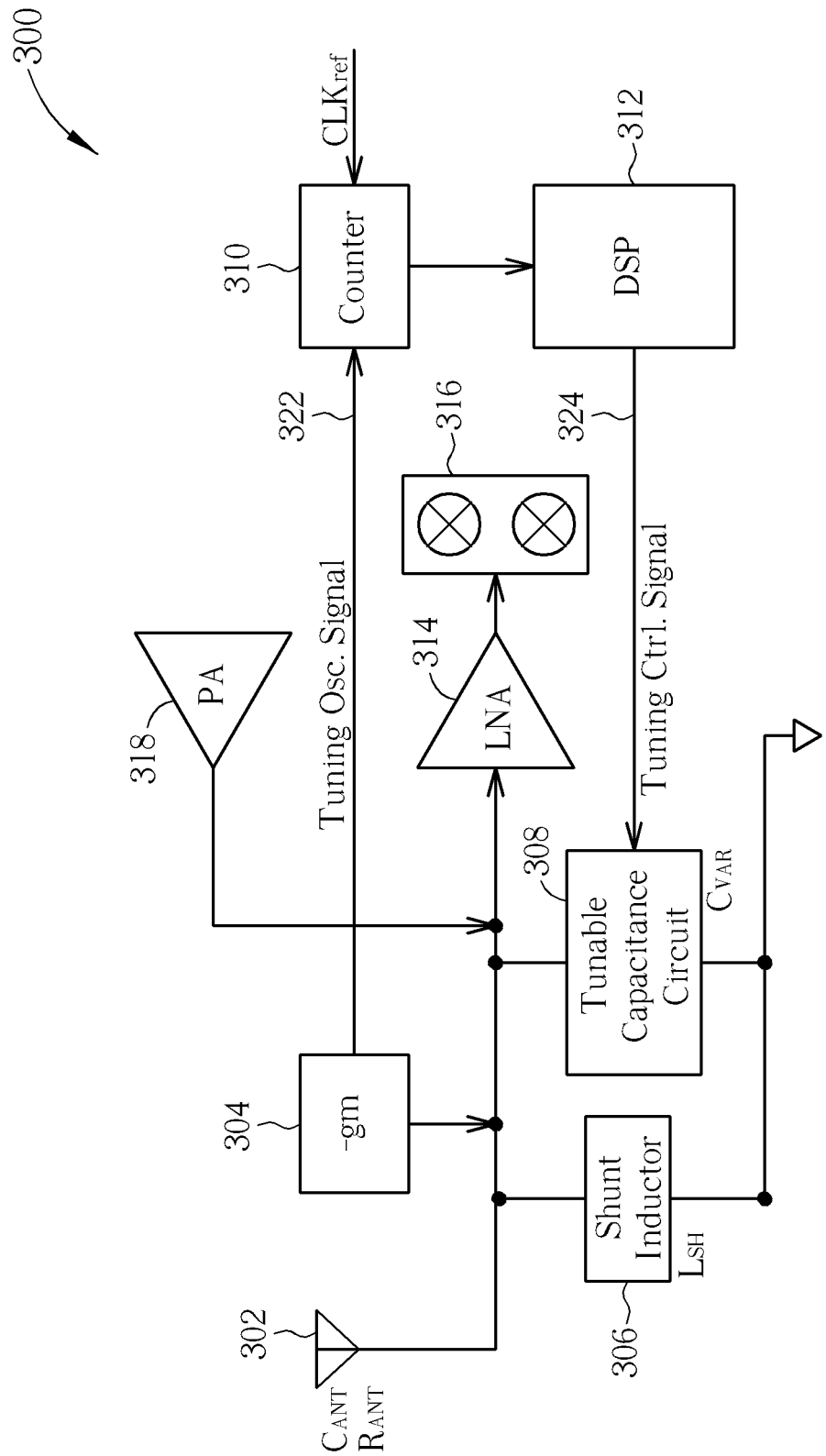
FIG. 4 illustrates a detailed block diagram of an RF transceiver front-end circuit.
Figure 5:
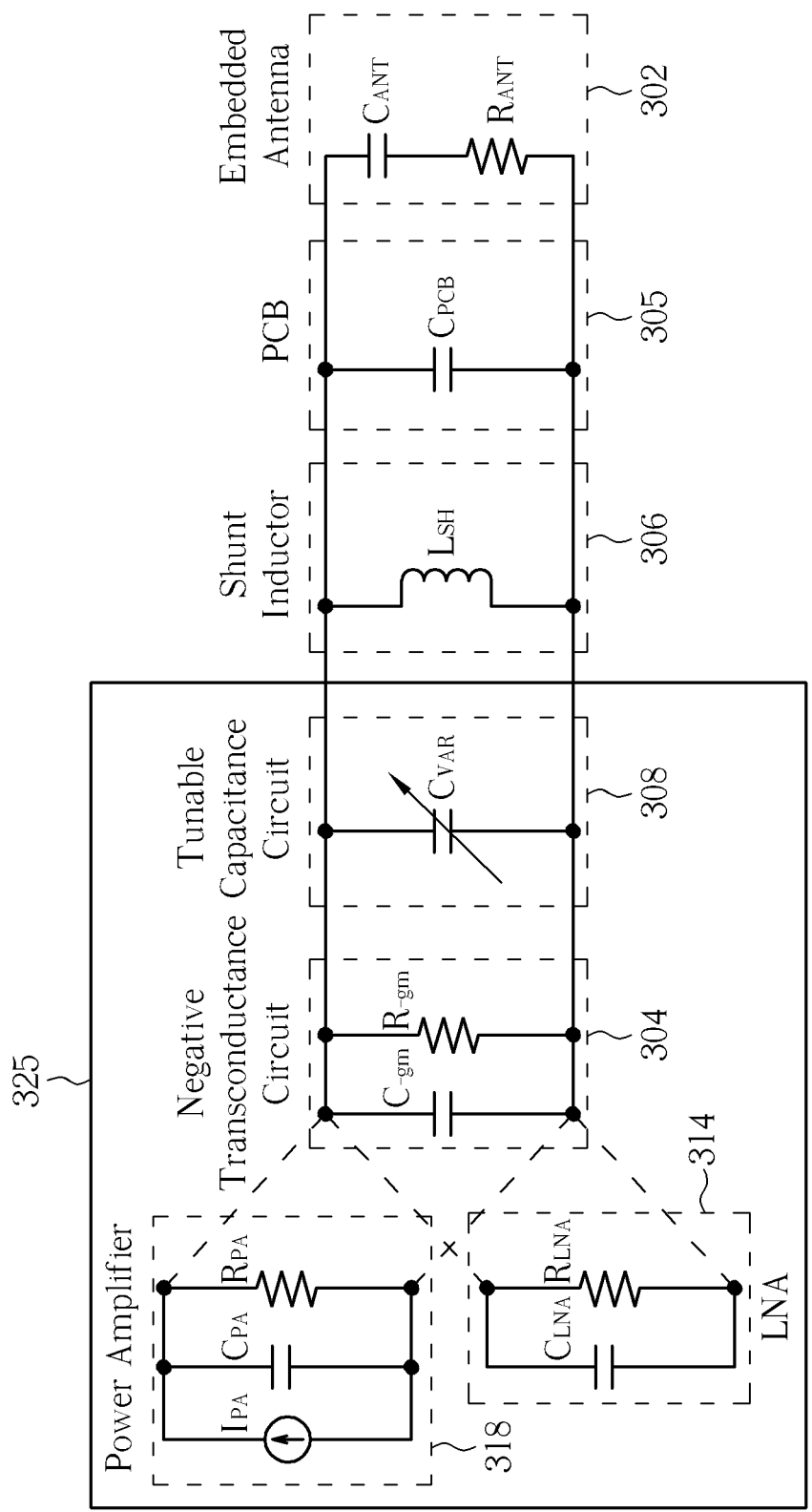
FIG. 5 is an equivalent circuit diagram modeling parts of the RF transceiver front-end circuit and their effect on an oscillation frequency of the resulting resonance tank.

FIG. 4 illustrates a detailed block diagram of an RF transceiver front-end circuit 300 according to one embodiment of the present invention. FIG. 5 is an equivalent circuit diagram modeling parts of the RF transceiver front-end circuit 300 and their effect on an oscillation frequency of the resulting resonance tank. A shunt inductor 306 resonates with the sum of all capacitance connected to the RF port and the resulting resonance frequency equals the desired channel frequency band. The tunable capacitance circuit 308 is controlled to tune (shift) this resonance frequency for different desired RF channels.

In the embodiment illustrated by FIG. 4, a negative transconductance circuit 304 of FIG. 4 corresponds to the negative transconductance circuit 104 of FIG. 2, the shunt inductor 306 and the tunable capacitance circuit 308 of FIG. 4 correspond to the tunable filter 102 of FIG. 2, a digital counter 310 of FIG. 4 corresponds to the counter 110 of FIG. 2, and a digital signal processor (DSP) 312 of FIG. 4 corresponds to the control circuit 112 of FIG. 2.

An embedded antenna 302 is used to transmit or receive RF signals, and the embedded antenna 302 can be modeled as an equivalent capacitance $C_{ANT}$ in series with an equivalent resistance $R_{ANT}$. One application of the RF transceiver front-end circuit 300 is supporting reception and transmission of RF signals within the frequency modulation (FM) broadcast frequency band of 76 MHz to 108 MHz.

It will be appreciated that the RF transceiver front-end circuit 300 satisfies the objective of automatically tuning the embedded antenna 302 for a desired FM channel within the FM frequency band of 76 MHz to 108 MHz. The tuning flexibility offered by the RF transceiver front-end circuit 300 also allows for a wide range of embedded antenna configurations to be used, allowing the circuit to be used in a variety of different products.

In an embodiment, an integrated circuit 325 is used for integrating several elements of the RF transceiver front-end circuit 300. In the description below, elements referred to as being "on-chip" are located on the integrated circuit 325, whereas those elements referred to being "off-chip" are not located on the integrated circuit 325. In an embodiment, all off-chip elements, along with the integrated circuit 325, are disposed on a PCB 305 for an example, and the PCB has its own equivalent capacitance $C_{PCB}$.

In an embodiment, the shunt inductor 306 is located off-chip, and is used to resonate with the capacitance $C_{ANT}$ of the embedded antenna 302. The shunt inductor 306 is realized as an equivalent inductance $L_{SH}$. The tunable capacitance circuit 308 is a variable on-chip capacitance circuit that can be discrete or continuous depending on the application and is controlled by a tuning control signal 324 output by the DSP 312 located on-chip. The tunable capacitance circuit 308 is realized as a variable capacitor $C_{VAR}$. The on-chip negative transconductance circuit 304 is used to provide a negative transconductance and oscillating with the resonance tank. The negative transconductance circuit 304 is modeled as an equivalent capacitance $C_{-gm}$ in parallel with an equivalent resistance $R_{-gm}$. At resonance the negative transconductance of the negative transconductance circuit 304 cancels the tank loss of the other elements in the RF transceiver front-end circuit 300 in order to sustain oscillation and produce a tuning oscillation signal 322.

In an embodiment, the tunable capacitance circuit 308 comprises a capacitor array, and can be located either on-chip or off-chip. The capacitance values of the tunable capacitance circuit 308 can be either discrete or continuous, and the tunable capacitance circuit 308 is digitally or analog or mixed analog and digitally controlled with the tuning control signal 324.

In an embodiment, the tunable capacitance circuit 308 is a tunable capacitance array, and both the tunable capacitance circuit 308 and the shunt inductor 306 are connected to the signal path using a shunt configuration. In yet another embodiment, as shown in FIG. 5, the embedded antenna 302 and the shunt inductor 306 are located off-chip, whereas the negative transconductance circuit and the tunable capacitance circuit 308 are located on-chip.

During calibration mode, the negative transconductance circuit 304 is enabled, and the digital counter 310 measures the oscillation frequency of the tuning oscillation signal 322 with respect to a reference clock CLKref. The reference clock CLKref is a substantially constant clock frequency that can be used as a reference for counting other signals. For instance the reference clock CLKref can be a 26 MHz clock produced by a crystal. The digital counter 310 and the reference clock CLKref can both be integrated on-chip. The digital counter 310 aids in the tuning process by counting pulses of the tuning oscillation signal 322 during a counting period indicated by the reference clock CLKref in order to calculate a counting value.

During the tuning process, the digital counter 310 counts the received number of pulses of the tuning oscillation signal 322 during the counting period to calculate the counting value. Meanwhile, the DSP 312 calculates an expected number of pulses of the tuning oscillation signal 322 that should be received during the counting period if the RF transceiver front-end circuit 300 is properly tuned to the correct frequency. The digital counter 310 then outputs the counting value to the DSP 312 in order for the DSP 312 to compare the counting value with the expected number of pulses. If the counting value received from the digital counter 310 is close enough, or within a predetermined range, of the expected value calculated by the DSP 312, then the RF transceiver front-end circuit 300 is considered to be properly tuned. If the counting value is not within the predetermined range of the expected value, the DSP 312 changes the value of the tuning control signal 324 to adjust the variable capacitance $C_{VAR}$ of the tunable capacitance circuit 308, thereby adjusting the oscillation frequency of the tuning oscillation signal 322. Once the tuning oscillation signal 322 is within an acceptable range, the DSP 312 latches the desired value of the tuning control signal 324 and then the negative transconductance circuit 304 is disabled for normal mode operation. Thus, using the above tuning method, the negative transconductance circuit 304 produces the tuning oscillation signal 322 that is used to adjust or tune the frequency of the RF transceiver front-end circuit 300. The digital counter 310 counts the oscillation frequency of the tuning oscillation signal 322 and provides this counting value to the DSP 312 as feedback. Using the feedback loop, the frequency of the RF transceiver front-end circuit 300 can be tuned quickly and automatically.

Please continue to refer to FIG. 4. The RF transceiver front-end circuit 300 has the functions of both transmitting RF signals and receiving RF signals. For receiving RF signals, a low noise amplifier (LNA) 314 located on-chip is used for amplifying received RF signals that are received through the embedded antenna 302 to produce amplified received RF signals. A receiving mixer 316 located on-chip is used for frequency down converting the amplified received RF signals for further processing. The input impedance of the LNA 314 can be modeled as an equivalent capacitance $C_{LNA}$ joined in parallel with an equivalent resistance $R_{LNA}$.

For transmitting RF signals, a power amplifier 318 located on-chip is used for amplifying RF signals to be transmitted to produce amplified output transmission RF signals for transmission through the embedded antenna 302. The power amplifier 318 can be realized as an equivalent current source $I_{PA}$ joined in parallel with both an equivalent capacitance $C_{PA}$ and an equivalent resistance $R_{PA}$.

Figure 6:
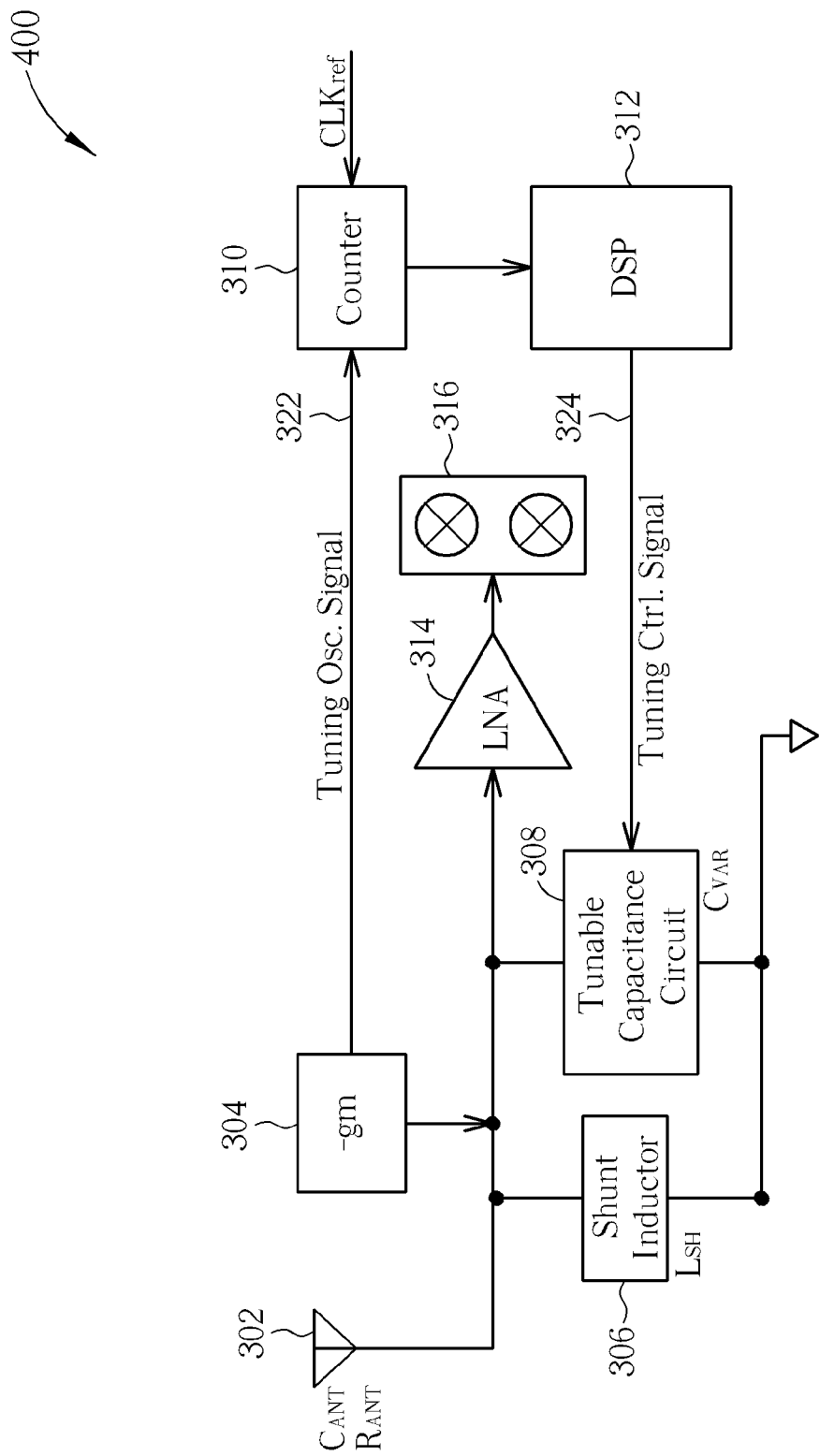
FIG. 6 illustrates a block diagram of an RF receiver front-end circuit.

FIG. 6 illustrates a block diagram of an RF receiver front-end circuit 400. Differing from the RF transceiver front-end circuit 300 shown in FIG. 4, the RF receiver front-end circuit 400 only receives RF signals and does not contain a transmitter function. Therefore, the power amplifier 318 used for transmitting RF signals are not included in the RF receiver front-end circuit 400. For all other elements in the RF receiver front-end circuit 400, their functions are the same as described above with respect to the RF transceiver front-end circuit 300.

Figure 7:
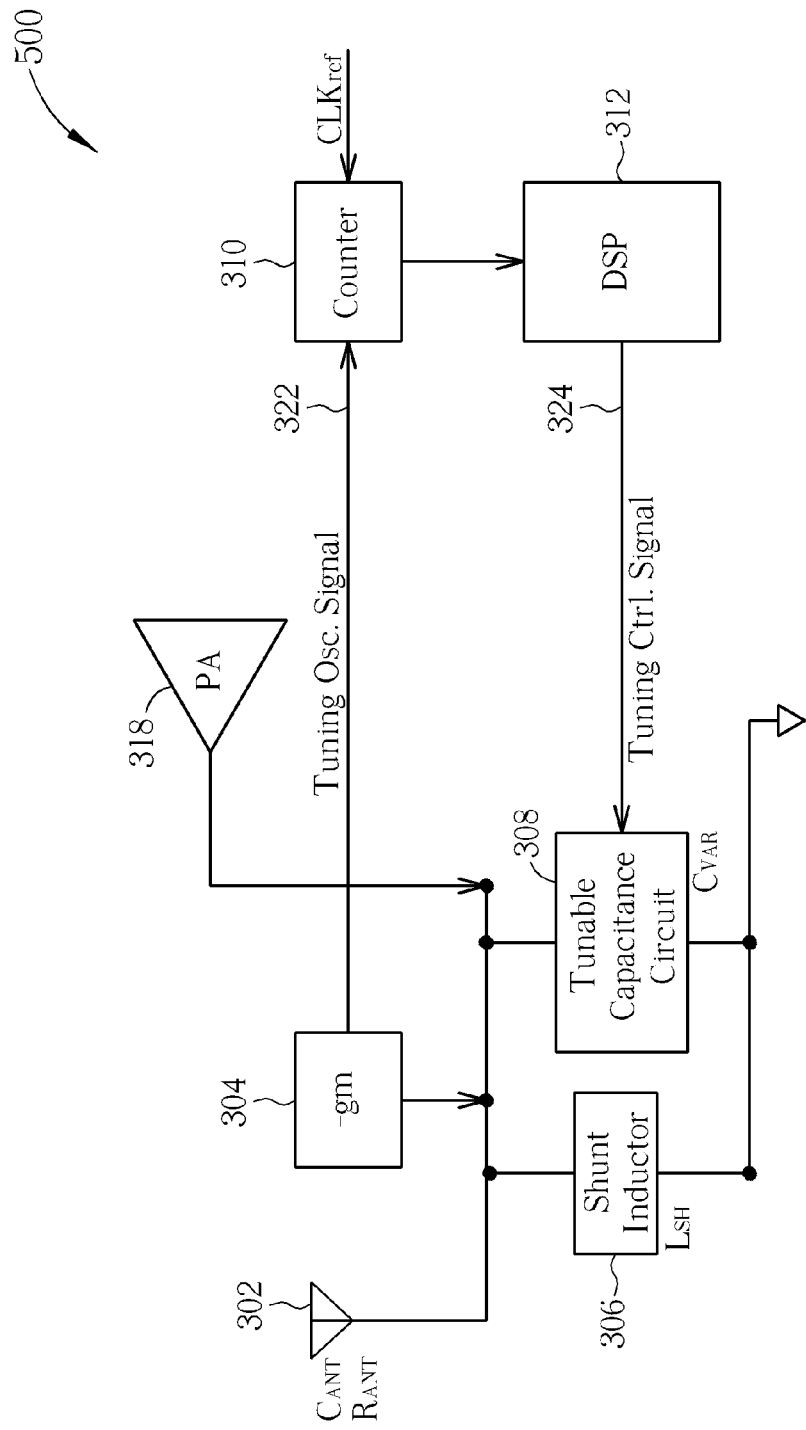
FIG. 7 illustrates a block diagram of an RF transmitter front-end circuit.

FIG. 7 illustrates a block diagram of an RF transmitter front-end circuit 500. Differing from the RF transceiver front-end circuit 300 shown in FIG. 4, the RF transmitter front-end circuit 500 only transmits RF signals and does not contain a receiver function. Therefore, the LNA 314 and the receiving mixer 316 used for receiving RF signals are not included in the RF transmitter front-end circuit 500. For all other elements in the RF transmitter front-end circuit 500, their functions are the same as described above with respect to the RF transceiver front-end circuit 300.

The RF transceiver front-end circuit 300, the RF receiver front-end circuit 400, and the RF transmitter front-end circuit 500 are well suited for receiving or transmitting FM radio signals. The embedded antenna 302 can have a length of less than $\lambda/4$, and even much less than $\lambda/10$, where the wave length $\lambda$ is related to the desired tuning frequency of the RF front-end circuit used to transmit or receive signals.

In addition to the simplicity of the proposed tuning method, another main advantage of using the proposed solution is that the tuning algorithm is very similar to that used for the tuning of an on-chip voltage controlled oscillator (VCO) used in a synthesizer of local oscillator (LO) generation used for a receiver or a transmitter. Therefore, the same digital hardware can be re-used for both the VCO and embedded antenna tuning. As a result, no extra digital hardware is needed.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A radio-frequency (RF) front-end circuit, comprising:
    a tunable filter;
    a negative transconductance circuit coupled with the tunable filter to produce a tuning oscillation signal, wherein the negative transconductance circuit is enabled to produce the tuning oscillator signal while the RF front-end circuit is in a calibration mode, and the negative transconductance circuit is disabled while the RF front-end circuit is in a normal mode during which no calibration of the RF front-end circuit is performed;
    a counter arranged to determine a frequency of the tuning oscillation signal; and
    a control circuit arranged to shift the frequency of the tuning oscillation signal by adjusting the tunable filter until the frequency of the tuning oscillation signal falls within an acceptable frequency range corresponding to a desired channel frequency band.

2. The RF front-end circuit of claim 1, wherein the tunable filter comprises:
    an inductor resonating with an equivalent capacitance of an antenna coupled to the RF front-end circuit to form a high resonance for boosting signals at the antenna; and
    a tunable capacitance circuit coupled to the inductor, wherein the tunable capacitance circuit is configured to be tuned by a tuning control signal so as to shift the frequency of the tuning oscillation signal.

3. The RF front-end circuit of claim 2, wherein the tunable capacitance circuit comprises a capacitor array of which the capacitance is discrete or continuous and is digitally or analog or both analog and digitally controlled.

4. The RF front-end circuit of claim 2, wherein the inductor is an off-chip shunt inductor and the tunable capacitance circuit is an on-chip shunt capacitor array.

5. The RF front-end circuit of claim 1, wherein
the counter counts pulses of the tuning oscillation signal during a counting period indicated by a reference clock to calculate a counting value; and
the control circuit calculates an expected number of pulses of the tuning oscillation signal to be received during the counting period for the desired channel frequency band of the RF front-end circuit, compares the expected number of pulses with the counting value calculated by the counter, and adjusts the tunable filter in order to adjust a frequency of the tuning oscillation signal until the counting value is within a predetermined range of the expected number of pulses.

6. The RF front-end circuit of claim 1, comprising at least one of a low noise amplifier and a power amplifier coupled to the negative transconductance circuit.

7. The RF front-end circuit of claim 1, being utilized in an RF transceiver, an RF receiver, or an RF transmitter.

8. The RF front-end circuit of claim 1, wherein the desired channel frequency band is a frequency modulation (FM) broadcast band.

9. The RF front-end circuit of claim 1 further comprising an integrated circuit formed on a printed circuit board, wherein the tunable filter, the negative transconductance circuit, the counter, and the control circuit are integrated on the integrated circuit.

10. A filter calibration system for a radio-frequency (RF) front-end circuit, comprising:
a tunable filter configured to be tuned to a desired channel by adjusting a tuning control signal, the tunable filter being tunable across a frequency spectrum including a plurality of channels;
a negative transconductance circuit coupled with the tunable filter to produce a tuning oscillation signal in a calibration mode of operation, wherein the negative transconductance circuit is enabled to produce the tuning oscillator signal while the RF front-end circuit is in the calibration mode, and the negative transconductance circuit is disabled while the RF front-end circuit is in a normal mode during which no calibration of the RF front-end circuit is performed; and
a control circuit receiving a feedback signal based on the tuning oscillation signal and accordingly shifting a frequency of the tuning oscillation signal by adjusting the tuning control signal to shift until the frequency of the tuning oscillation signal falls within an acceptable frequency range corresponding to a desired channel frequency band.

11. The filter calibration system of claim 10, wherein the feedback signal is created by a counter arranged to determine the frequency of the tuning oscillation signal.

12. The filter calibration system of claim 11, wherein
the counter counts pulses of the tuning oscillation signal during a counting period indicated by a reference clock to calculate a counting value; and
the control circuit calculates an expected number of pulses of the tuning oscillation signal to be received during the counting period for the desired channel frequency band of the RF front-end circuit, compares the expected number of pulses with the counting value calculated by the counter, and adjusts the tuning control signal in order to adjust a frequency of the tuning oscillation signal until the counting value is within a predetermined range of the expected number of pulses.

13. The filter calibration system of claim 10, wherein the tunable filter comprises:
an inductor resonating with an equivalent capacitance of an antenna coupled to the RF front-end circuit to form a high resonance for boosting signals at the antenna; and
a tunable capacitance circuit coupled to the inductor, wherein the tunable capacitance circuit is configured to be tuned by the tuning control signal.

14. The filter calibration system of claim 13, wherein the tunable capacitance circuit comprises a capacitor array of which the capacitance is discrete or continuous and is digitally or analog or both analog and digitally controlled.

15. The filter calibration system of claim 13, wherein the inductor is an off-chip shunt inductor and the tunable capacitance circuit is an on-chip shunt capacitor array.

16. The filter calibration system of claim 10, wherein the negative transconductance circuit and the control circuit are integrated on a same integrated circuit of the RF front-end circuit.

17. The filter calibration system of claim 10, being utilized in an RF transceiver, an RF receiver, or an RF transmitter.

18. The filter calibration system of claim 10, wherein the desired channel frequency band is a frequency modulation (FM) broadcast band.

19. The filter calibration system of claim 10 further comprising an integrated circuit formed on a printed circuit board, wherein the negative transconductance circuit and the control circuit are integrated on the integrated circuit.

20. A method of tuning a radio-frequency (RF) front-end circuit, the method comprising the steps of:
producing a tuning oscillation signal with a negative transconductance circuit coupled with a tunable filter;
enabling the negative transconductance circuit to produce the tuning oscillator signal while the RF front-end circuit is in a calibration mode;
disabling the negative transconductance circuit while the RF front-end circuit is in a normal mode during which no calibration of the RF front-end circuit is performed;
determining a frequency of the tuning oscillation signal; and
shifting the frequency of the tuning oscillation signal by adjusting the tunable filter until the frequency of the tuning oscillation signal falls within an acceptable frequency range corresponding to a desired channel frequency band.

21. The method of claim 20, wherein the tunable filter comprises an inductor and a tunable capacitance circuit, the inductor resonating with an equivalent capacitance coupled to an antenna of the RF front-end circuit to form a high resonance for boosting signals at the antenna, and the method further comprises tuning the tunable capacitance circuit by a tuning control signal so as to shift the frequency of the tuning oscillation signal.

22. The method of claim 21, wherein the tunable capacitance circuit comprises a capacitor array of which the capacitance is discrete or continuous and is digitally or analog or both analog and digitally controlled.

23. The method of claim 21, wherein the inductor is an off-chip shunt inductor and the tunable capacitance circuit is an on-chip shunt capacitor array.

24. The method of claim 20, wherein
    determining the frequency of the tuning oscillation signal is performed by counting pulses of the tuning oscillation signal during a counting period indicated by a reference clock for calculating a counting value; and
    shifting the frequency of the tuning oscillation signal comprises calculating an expected number of pulses of the tuning oscillation signal to be received during the counting period for the desired channel frequency band of the RF front-end circuit, comparing the expected number of pulses with the counting value, and adjusting the tunable filter in order to adjust a frequency of the tuning oscillation signal until the counting value is within a predetermined range of the expected number of pulses.

25. The method of claim 20, being utilized in an RF transceiver, an RF receiver, or an RF transmitter.

26. The method of claim 20, wherein the desired channel frequency band is a frequency modulation (FM) broadcast band.

27. The RF front-end circuit of claim 1, wherein an embedded antenna of the RF front-end circuit is modeled as a capacitor and is tuned to the desired channel frequency band.

28. The filter calibration system of claim 10, wherein an embedded antenna of the RF front-end circuit is modeled as a capacitor and is tuned to the desired channel frequency band.

29. The method of claim 20, wherein an embedded antenna of the RF front-end circuit is modeled as a capacitor and is tuned to the desired channel frequency band.

\* \* \* \* \*